Feb. 5, 1952 J. LONGO ET AL 2,584,213

AMPLIFYING SYSTEM

Filed May 1, 1950

Inventors
JOHN LONGO,
SIMEON I. TOURSHOU AND
ROBERT J. LEWIS
BY
ATTORNEY

Patented Feb. 5, 1952

2,584,213

UNITED STATES PATENT OFFICE 2,584,213

AMPLIFYING SYSTEM

John Longo and Simeon I. Tourshou, Philadelphia, Pa., and Robert J. Lewis, Audubon, N. J., assignors to Radio Corporation of America, a corporation of Delaware Application May 1, 1950, Serial No. 159,354

11 Claims. (Cl. 315—27)

The present invention relates to high efficiency electronic power amplifying systems, and more particularly although not necessarily exclusively, to such systems in which the electron discharge tube employed as an amplifier is made conductive for only a portion of the period of the signal excursion applied to the tube.

More particularly the present invention relates to high efficiency power amplifiers of the type used in present-day electromagnetic beam deflection circuits as, for example, found in television receivers.

As is well known by those skilled in the electronic art, the power efficiency of signal amplifiers can be made increasingly higher by reducing the duty cycle of the electron tube involved. The lowest efficiency amplifier type is the class "A" amplifier in which plate current flows in the electron tube continuously. The signal applied to the amplifier operates on a linear part of the tube characteristic to produce a very faithful amplification of the signal. Class "B" type signal amplifiers are usually found in push-pull type systems where each tube, although statically conductive is driven into high current conduction by opposite polarity excursions of the applied signal. The efficiency is thus made higher, but the fidelity, unless extreme care is taken, may suffer. In class "C" type amplifiers, fidelity is of no importance and power efficiency is of sole concern. Here, the applied signal causes the class "C" amplifier type to conduct only for a very small portion of the signal period.

A form of the class "C" amplifier is today used in commercial television deflection systems. For example, in an electromagnetic beam deflection system a saw-tooth of voltage is applied to the grid of a power amplifier tube. If reaction scanning techniques are employed, the amplifier tube need conduct only for a little over half of the total saw-tooth period. The remaining saw-tooth of deflection current in the electromagnetic yoke is, as well known in reaction scanning systems, supplied by a damping tube which captures and puts to work the stored magnetic energy in the yoke. However, as the cathode ray tube screen areas of television receivers become greater, more and more power is required to successfully deflect the electron beam.

Thus, in order to reduce the cost of deflection power amplifiers, an effort has been extended to increase the efficiency of deflection power amplifier circuits so as to get the required increased deflection with presently available low cost, lower power tubes.

It is, therefore, a purpose of the present invention to provide an improved mode of operating electron discharge tubes so as to increase their effective power handling capabilities.

It is a further purpose of the present invention to provide a signal control system for class "C" type amplifiers which will considerably increase their power handling abilities.

It is a still further purpose of the present invention to provide an improved power amplifier circuit for electromagnetic cathode ray beam deflection whereby additional useful deflection may be obtained from existing power amplifier tubes having limited power handling abilities.

In realizing the above advantage, the present invention, as applied for example to class "C" type amplifiers using screen grid tubes, contemplates the following arrangement. A special control signal is generated whose frequency is equal to or an integral multiple of the signal frequency being handled by the power amplifier. The phase and wave form of this signal is so adjusted that when applied to the screen electrode of the power tube the screen grid electrode is swung negatively during non-conduction of the discharge tube and swung positively during the conduction of the discharge tube. Thus where the load circuit of the amplifier tube is of the oscillatory type, such as found in electromagnetic deflection systems, considerable increase in power output is gained. This is caused since during cut-off the tube is further disabled by the invention from conduction by the negative excursion of the screen. This prevents any possible unwanted damping of load circuit signals by the anode-cathode path of the tube. During conduction, however, the screen grid receives a positive-going excursion which increases the amplitude of power tube anode current above that otherwise obtained.

Other objects, features and advantages in addition to those set forth herein above, as well as a more complete understanding of the present invention will appear from a reading of the following specification especially when taken in combination with the following drawings in which.

Figure 1:
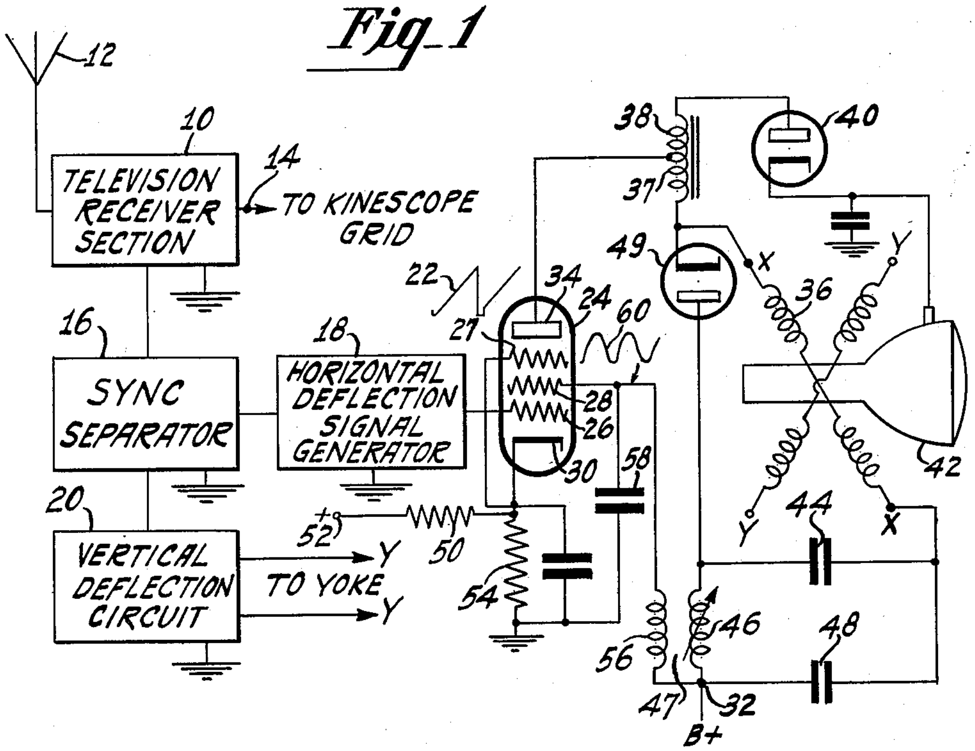
Figure 1 is a combination block diagram and schematic representation of one form of the invention as applied to a typical electro-magnetic system for a television receiver.

Turning now to Fig. 1, there is indicated at 10 a section of a typical modern-day television receiver. The block 10 may include an RF tuner signal converter, video IF amplifier, video demodulator and sound channel. Signals intercepted by the antenna 12 will than be amplified and demodulated to appear at the output terminal 14 of the receiver. The signals at 14 may, of course, be applied to any type of image reproducer such as, for example, a kinescope. The demodulated signal is also applied to a sync separator circuit shown at 16. The output of the sync separator is then applied for synchronizing a horizontal deflection generator 18 as well as a vertical deflection circuit at 20. Generally, the signal wave form appearing at the output of the signal generator 18 is of saw-tooth form shown for example at 22. Examples of suitable circuits for the block representation of the television receiving circuit elements 10 through 20 are shown and discussed in an article entitled "Television Receivers" by Antony Wright appearing in the RCA Review for March 1947.

The output of the horizontal deflection signal generator is applied to some form of electron discharge amplifying tube such as illustrated at 24. By way of example the tube 24 has been shown as a pentode-type tube. The deflection signal 22 is applied to the control grid 26 of the tube. The suppressor grid 27 is connected with the cathode. Screen grid 28 is positively biased with respect to the cathode 30 by means of its connection to the positive power supply terminal 32. The anode 34 of the pentode 24 may be provided with any form of load circuit for coupling with the deflection yoke winding at 36. A number of suitable deflection circuits which may be connected with the anode of the tube 24 are shown and discussed in an article entitled "Television Deflection Circuits" by A. W. Friend appearing in the RCA Review for March 1947. Another article entitled "Magnetic Deflection Circuits for Cathode Ray Tubes" by Otto H. Schade appearing in the RCA Review for September 1947 discusses even other typical electromagnetic deflection circuits suitable for connection with the anode of pentode 24.

The particular deflection circuit shown in Fig. 1 is of the direct drive variety. That is, one in which the deflection yoke winding 36 is directly connected as part of the anode-cathode load circuit of the pentode 24. As noted above, this circuit is, of course, exemplary and may be replaced as far as the present invention is concerned by any type of deflection system.

The particular direct drive system shown in Fig. 1 comprises a connection from the anode 34 to the primary of a high voltage pulse step-up transformer 37. Resulting positive-going pulses appearing across the secondary 38 are rectified by the diode 40 to produce beam-accelerating potential for the kinescope 42. The lower extremity on the winding 37 is then connected with the horizontal deflection yoke winding 36 of the deflection yoke. From the lower end of the deflection yoke winding a capacitor 44 is connected to the upper end of the transformer primary 46. The lower extremity of the transformer primary 46 is connected to the power supply terminal 32. An additional capacitor 48 is connected from the lower end of the winding 36 to the positive power supply terminal 32. Detailed description of how this circuit operates may be found in the Radio Corporation of America Service Notes on Television Receiver Models T–164, TC 166, TC 167, TC 168, first edition dated March 10, 1950. The particular direct-drive circuit shown is also more fully described in co-pending U. S. patent application Serial No. 90,612, filed April 30, 1949, by Simeon I. Tourshou entitled "Television Deflection Power Recovery Circuits," Patent No. 2,555,831, granted June 5, 1951.

Briefly, the discharge tube 24 is biased by means of the bleeder resistor 50 connected from the positive source of supply 52 to the cathode 30 of the output tube. The resulting voltage drop across the cathode resistor 54 biases the tube so that under normal operating conditions the tube conducts only during the positive-going extremities of the saw-tooth 22. This causes a saw-tooth of current flow to start building up in the yoke winding 36. As soon as the retrace portion of the saw-tooth occurs an oscillatory ringing starts in the deflection yoke winding 36. This is damped by the diode 49 to cause a saw-tooth of current to start flowing in the yoke 36 in the opposite direction. By properly adjusting the bias on the tube 24 and the amplitude of the signal 22, a quite linear saw-tooth of current suitable for deflection purposes may be produced through the yoke winding 36.

However, according to the embodiment of the present invention shown in Fig. 1, the secondary 56 of the transformer 47 is connected in series with the circuit path between the positive power supply terminal 32 and the screen grid 28. A capacitor 58 connected from the screen grid to ground may be chosen in value to tune the inductance of the secondary 56 to a signal frequency which is either equal to or the harmonic of the deflection signal 22. This will produce a signal wave form on the screen grid 28 which is basically sinusoidal in form but having some irregularities due to the saw-tooth drive. By way of example, such a wave form may appear like that shown at 60.

In the operation of the present invention the phase of the wave form 60 is so adjusted that the screen grid 28 swings positively during conduction of the pentode 24. On the other hand, during non-conduction of the pentode 24 the screen 28 is made to swing negatively. The negative-going swing during cut-off of the tube renders the anode-cathode path of the tube a very high impedance. This prevents any magnetic energy in the deflection system from being wasted across residual anode-cathode resistance of the output tube. On the other hand, since the screen is made to swing positively, in accordance with the present invention, during conduction of the output tube, a much higher power output from the tube is made possible. Since this higher screen voltage is only effective for but a brief period, the average screen dissipation of the tube is kept low. By properly proportioning the control signal 60 applied to the screen, an increase in deflection amplitude of 20 to 30 percent over any presently known prior art arrangement may be achieved without unduly burdening the tube 24.

Figure 2:
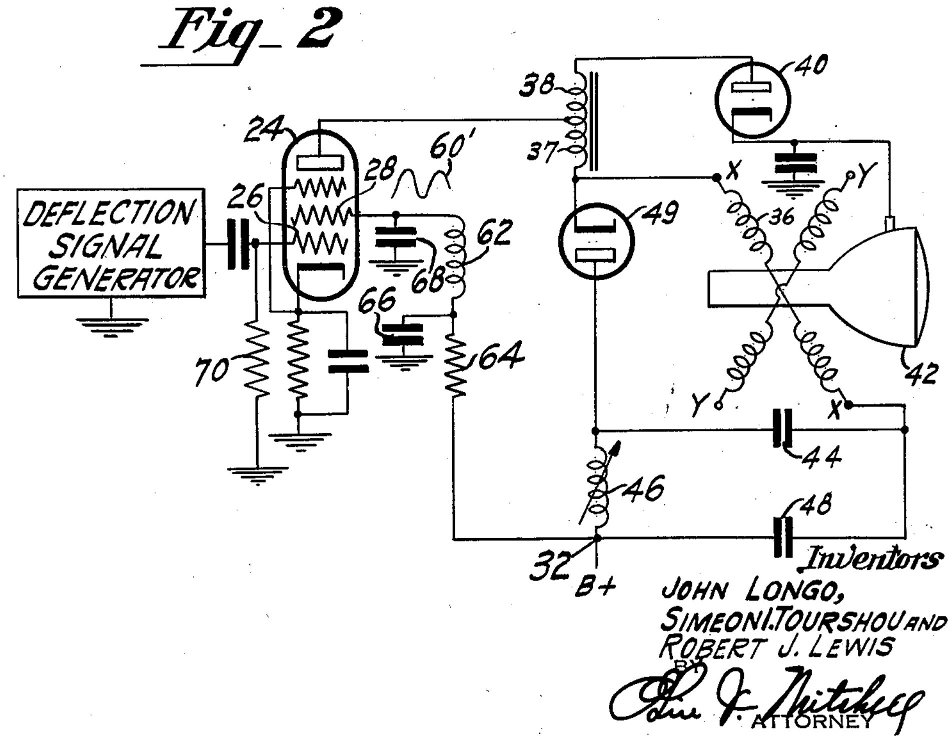
Figure 2 is a combination block diagram and schematic representation of yet another embodiment of the present invention useful for application in electromagnetic cathode ray beam deflection systems.

The way in which the control signal 60 is applied to the screen of the output tube is not of too great importance provided it is of the proper phase and amplitude. For example, the arrangement shown in Fig. 2 shows a simplified form of the present invention. As inspection will show, the general direct-drive deflection circuit of Fig. 2 is the same as that shown in Fig. 1 and like components have been given similar reference numerals. However, in Fig. 2, instead of developing the control signal by means of a transformer responsive to current variations in the output circuit of the tube 24, the control voltage is developed simply by shock excitation of a tuned circuit. In Fig. 2, therefore, the screen 28 is connected with the positive power supply terminal 32 through a given inductance 62. The dropping resistor 64 by-passed by capacitor 66 may be employed to adjust screen potential if desired. In Fig. 2, however, the capacitor 68 is selected in value to form a tuned circuit with the inductance 62. As in Fig. 1, the frequency of this resonance may be either equal to the deflection rate of the system or a harmonic thereof. The resulting control signal 60′ superimposed on the positive bias of the screen 28 will act as described in Fig. 1 to increase the efficiency of the amplifying stage. In Fig. 2, the proper bias for the discharge tube 24 is obtained not through a cathode bleeder system as in Fig. 1 but through a combination grid leak bias and cathode bias arrangement. Grid leak resistor 70 connected from the grid 26 to ground is selected in value to obtain the required bias conditions.

Although the present invention has been described in connection with a pentode-type amplifier tube, it is apparent that other multi-grid type tubes may be substituted therefor without departing from the spirit and scope of the present invention. Furthermore, although particular attention has been directed to deflection type class "C" amplifiers, it will be clear that amplifiers for purposes other than deflection may take advantage of the improvement provided by the present invention.

Having thus described our invention what is claimed is:

1. In an electro-magnetic cathode ray beam deflection system adapted for excitation of a beam deflection yoke, a combination of a source of deflection signal having a predetermined frequency, an electron discharge tube having at least an anode, cathode, a first control electrode and a second control electrode, connections for applying the output of said deflection signal source to said first control electrode of said discharge tube, an output circuit connected between the anode and cathode of said discharge tube, circuit means for exciting the deflection yoke with energy developed in said output circuit, means connected between said second control electrode and said cathode for biasing said second control electrode positively with respect to said cathode, a source of substantially sinusoidal control signal having the frequency and phase thereof related to said deflection signal frequency in a predetermined manner, and means for super-imposing said control frequency upon the positive bias applied to said second control electrode.

2. Apparatus according to claim 1 wherein said deflection signal source is productive of a substantially saw-tooth wave form.

3. Apparatus according to claim 1 wherein said source of control signal comprises means for generating an electrical signal in accordance with current flow in the output circuit of said discharge tube.

4. In an electrical signal amplifying circuit, the combination of a source of signal voltage, an electron discharge tube having at least an anode, cathode, a first control electrode and a second control electrode, said second control electrode being adjacent to said first control electrode but more remote from said cathode than said first control electrode, means for applying the output of said signal source between the first control electrode and cathode of said discharge tube, means for negatively biasing said first control electrode relative to said cathode such that said discharge tube is conductive for only a portion of the wave form defined by said signal source, an output circuit for said discharge tube connected between said anode and said cathode, means for biasing said second control electrode positively with respect to said cathode, a source of control signal having a frequency which is an integral multiple of said signal voltage, and means for super-imposing said control signal upon the positive bias applied to said second control electrode.

5. Apparatus according to claim 4 wherein said source of control signal comprises means coupled with said output circuit for developing an electrical waveform in accordance with current variations in said output circuit.

6. Apparatus according to claim 5 wherein the waveform and phase of said control signal is so determined and related to said signal voltage and first control electrode bias that said second control electrode is swung in a negative direction during non-conduction of said discharge tube and in a positive direction during conduction of said discharge tube.

7. An electron ray beam deflection system employing a deflection yoke having deflection winding terminals, the combination of a source of deflection voltage having at least a saw-tooth component, an electron discharge tube having at least an anode, cathode, control electrode and screen electrode, means for applying said deflection signal between the control electrode and cathode of said discharge tube, means for biasing said control electrode relative to said cathode such that said discharge tube is rendered conductive only during a positive-going portion of said deflection signal, an output circuit connected between said discharge tube anode and its respective cathode, said output circuit including means for positively biasing said anode relative to said cathode, means connected with said output circuit and said deflection yoke winding terminals for exciting said yoke from energy developed in said output circuit, means for generating a substantially sinusoidal control signal having a frequency which is an integral multiple of the deflection signal frequency, means for biasing said screen electrode positively with respect to said cathode, and means for super-imposing the said control signal on the positive bias applied to said screen electrode.

8. Apparatus according to claim 7 wherein said means for generating a control signal comprises a parallel tuned circuit serially connected between said screen electrode and said biasing means for said screen electrode.

9. Apparatus according to claim 7 wherein said means for generating a control signal comprises a transformer having a primary and secondary winding, said primary winding being connected with said output circuit for excitation thereby while one terminal of said secondary winding is coupled with said screen electrode and the other terminal of said secondary winding is coupled with the end of said primary winding adjacent the cathode of said tube.

10. In an electrode-magnetic cathode ray deflection system of the direct drive type which employs a deflection yoke having two utilization terminals for energizing the complete yoke deflection winding, said deflection yoke utilization terminals being serially connected in the anode-cathode circuit of a screen grid output vacuum tube amplifier, the combination of, a first capacitor connected in series with said deflection coil terminals in the vacuum tube amplifier anode-cathode circuit, a transformer having a primary and a secondary winding, a second capacitor connected in series with said transformer primary winding to form a combination, connections placing said combination in shunt with a portion of the amplifier anode-cathode circuit which includes said first capacitor, a unilaterally conductive damping device connected in shunt through at least a portion of said transformer primary winding with a portion of said vacuum tube amplifier anode-cathode circuit, and a connection from the screen grid of said vacuum tube amplifier through said transformer secondary winding to a source of positive potential.

11. In an electro magnetic cathode ray deflection system of the direct drive type which employs a deflection yoke having two utilization terminals for energizing the complete yoke deflection winding, said deflection yoke utilization terminals being serially connected in the anode-cathode circuit of a screen grid vacuum tube amplifier, the combination of, a first capacitor connected in series with said deflection coil terminals in the vacuum tube amplifier anode-cathode circuit, an inductance and second capacitor connected in series with one another to form a combination, connections placing said inductance and capacitor combination in shunt with a portion of the amplifier anode-cathode circuit which includes said first capacitor, a unilaterally conductive damping device connected in shunt through at least a portion of said inductance with a portion of said output amplifier anode-cathode circuit, and a second inductance connected from the screen grid of said vacuum tube amplifier to a source of positive potential.

JOHN LONGO.
SIMEON I. TOURSHOU.
ROBERT J. LEWIS.

REFERENCES CITED

The following references are of record in the file of this patent:

UNITED STATES PATENTS

| Number | Name | Date |
|---|---|---|
| 2,284,378 | Dome | May 26, 1942 |
| 2,414,546 | Nagel | Jan. 21, 1947 |
| 2,436,447 | Packard | Feb. 24, 1948 |
| 2,445,017 | Boadle et al. | July 13, 1948 |
| 2,470,197 | Torsch | May 17, 1949 |
| 2,474,474 | Friend | June 28, 1949 |
| 2,482,150 | Bocciarelli | Sept. 20, 1949 |
| 2,482,737 | Shaw | Sept. 20, 1949 |
| 2,490,743 | Sziklai | Dec. 6, 1949 |
| 2,510,027 | Torsch | May 30, 1950 |